US008686888B2

(12) United States Patent
Chou et al.

(10) Patent No.: US 8,686,888 B2
(45) Date of Patent: Apr. 1, 2014

(54) COMPLEMENTARY SWITCHED CAPACITOR AMPLIFIER FOR PIPELINED ADCS AND OTHER APPLICATIONS

(75) Inventors: Wei-Te Chou, Irivne, CA (US); Jiangfeng Wu, Irvine, CA (US); Wenbo Liu, Costa Mesa, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/543,386

(22) Filed: Jul. 6, 2012

(65) Prior Publication Data

US 2014/0009316 A1    Jan. 9, 2014

(51) Int. Cl.
*H03M 1/38*    (2006.01)
(52) U.S. Cl.
USPC ............................ 341/161; 341/155
(58) Field of Classification Search
USPC ................... 341/161, 155, 172, 156
See application file for complete search history.

(56) References Cited

U.S. PATENT DOCUMENTS

| 8,120,519 | B2 * | 2/2012 | Bales | 341/161 |
| 2005/0219097 | A1 | 10/2005 | Atriss et al. | |
| 2009/0066416 | A1 * | 3/2009 | Adachi | 330/255 |

OTHER PUBLICATIONS

European Search Report for EP Patent Application No. EP13003348. 3, European Patent Office, Munich, Germany, mailed on Nov. 27, 2013.

S. Kawahito, "Low-Power Design of Pipeline A/D Converters," IEEE 2006 Custom Integrated Circuits Conference (CICC), Sep. 1. 2006, pp. 505-512, Piscataway, New Jersey.

Varzaghani, A., et al., "A 4.8 GS/s 5-bit ADC-Based Receiver With Embedded DFE for Signal Equalization," *IEEE Journal of Solid-State Circuits*, Mar. 2009, pp. 901-915, vol. 44, Piscataway, New Jersey.

Manas, K.H., et al., "Design of Low Power Parallel Pipeline ADC in 180nm Standard CMOS Process," Communications and Signal Processing (ICCSP), 2011 International Conference on IEEE, Feb. 10, 2011, pp. 9-13.

Kawahito, S., et al., "A 15b Power-Efficient Pipeline A/D Converter Using Non-Stewing Closed-Loop Amplifiers," Custom Integrated Circuits Conference, IEEE, 2008, pp. 117-120, Piscataway, New Jersey.

\* cited by examiner

*Primary Examiner* — Joseph Lauture
(74) *Attorney, Agent, or Firm* — Sterne, Kessler, Goldstein & Fox P.L.L.C.

(57) ABSTRACT

The present disclosure is directed to a switched capacitor amplifier that includes a switched capacitor network and a complementary push-pull amplifier. The switched capacitor amplifier of the present disclosure can provide a larger fraction of the charge provided by a power supply and flowing through the amplifier to a capacitive load at the output of the amplifier compared to switched capacitor amplifiers that use single-ended class-A amplifiers. The switched capacitor amplifier of the present disclosure can be used in a converter stage of a pipelined analog-to-digital converter (ADC) to improve the ADC's power efficiency and/or bandwidth. It can be further generalized to be used in other applications other than pipelined ADCs.

20 Claims, 7 Drawing Sheets

US 8,686,888 B2

COMPLEMENTARY SWITCHED CAPACITOR AMPLIFIER FOR PIPELINED ADCS AND OTHER APPLICATIONS

FIELD OF THE INVENTION

This application relates generally to amplifiers and, more particularly, to complementary switched capacitor amplifiers.

BACKGROUND

The pipelined analog-to-digital converter (ADC) is a popular architecture for converting analog signals to digital signals at resolutions of 8-14 bits and conversion speeds ranging from 1-5000 Mega-samples per second (MS/s), for example. Typical applications include digital receivers, base stations, digital imaging and video, and ultrasound.

Among the critical building blocks in the pipelined ADC is the multiplying digital-to-analog converter (MDAC), which interfaces successive converter stages in the pipeline. In the conventional implementation, the core of the MDAC is constructed using switched capacitor technology formed around a class-A transconductance amplifier. The charge transfer from the power supply to the capacitive load of the transconductance amplifier in this conventional MDAC is inherently inefficient because the amplifier draws a constant current, while it delivers on average only a small fraction of this current to the load. This inefficiency negatively effects the power consumption and/or bandwidth of the pipelined ADC.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

I. PIPELINED ADC OVERVIEW

Figure 1:
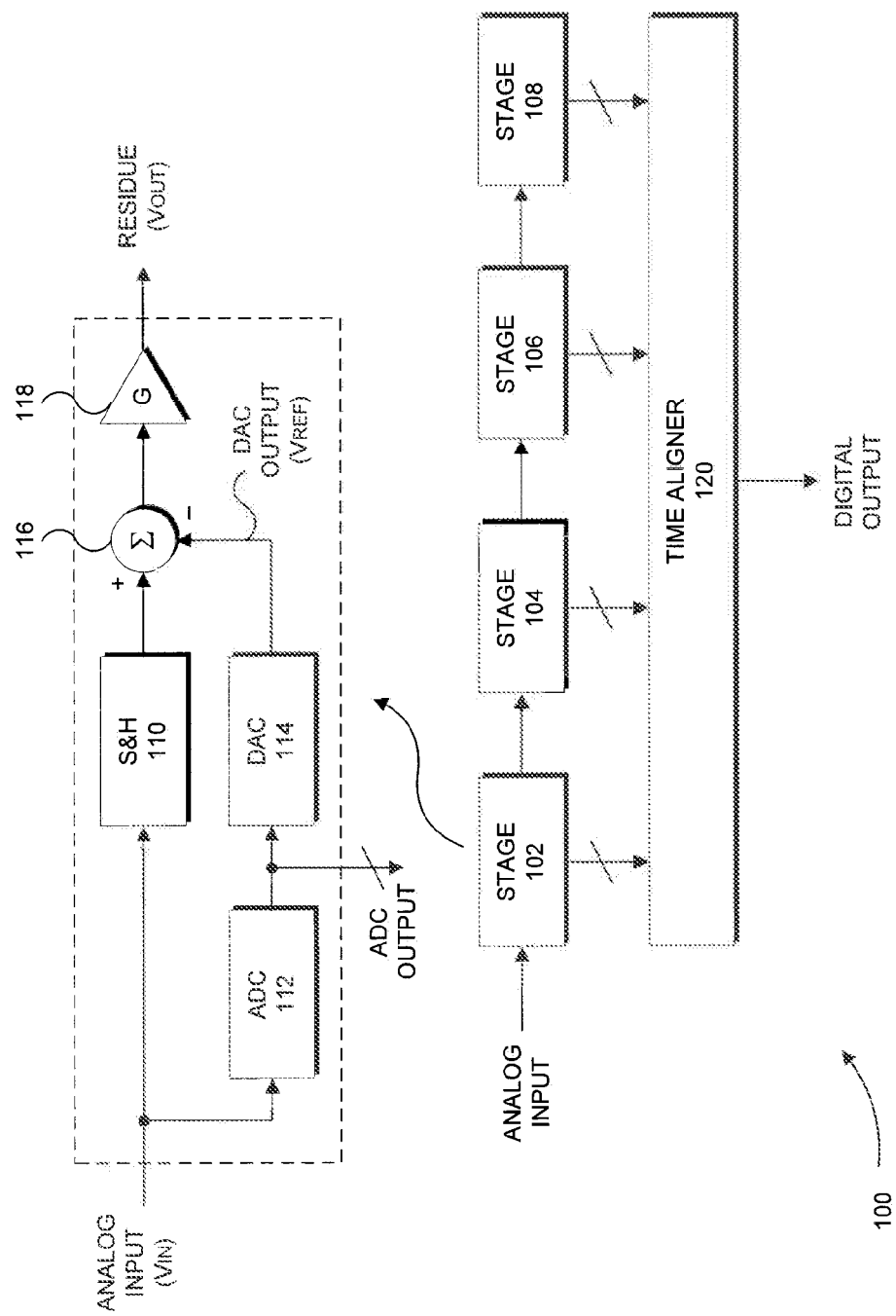
FIG. 1 illustrates a block diagram of a pipelined ADC in accordance with embodiments of the present disclosure.

FIG. 1 illustrates a conceptual block diagram of a pipelined ADC 100, in accordance with embodiments of the present disclosure. As shown in FIG. 1, pipelined ADC 100 includes four cascaded converter stages 102-108 that sequentially process an analog input signal to convert the analog input signal into a digital output signal. An exemplary configuration of a converter stage is shown at the top of FIG. 1 in further detail.

In general, each converter stage 102-108 samples and holds its analog input using sample and hold circuit 110 and performs a coarse analog-to-digital conversion of its analog input using ADC 112. The error of the conversion performed by ADC 112 is computed by converting the output of ADC 112 back into the analog domain using digital-to-analog converter (DAC) 114 and subtracting the output of DAC 114 from the output of sample and hold circuit 114 using subtractor 116. The resultant error value output by subtractor 116, referred to as the residue, is then amplified by amplifier 118 and fed to the next converter stage to extract additional bits. The final converter stage 108 may contain only an ADC 112 because there is no need to compute any further residue. The ADC outputs from each converter stage 102-108 are aligned in time and combined using time aligner 120 to yield the final digital output.

One of the critical building blocks of the pipelined ADC, such as pipelined ADC 100, is the multiplying DAC (MDAC). The MDAC is typically included in each converter stage of the pipelined ADC and performs the function of sample and hold circuit 110, DAC 114, subtractor 116, and amplifier 118 as described above. The performance of this block usually dictates the power efficiency and/or bandwidth of the entire pipelined ADC.

Figure 2:
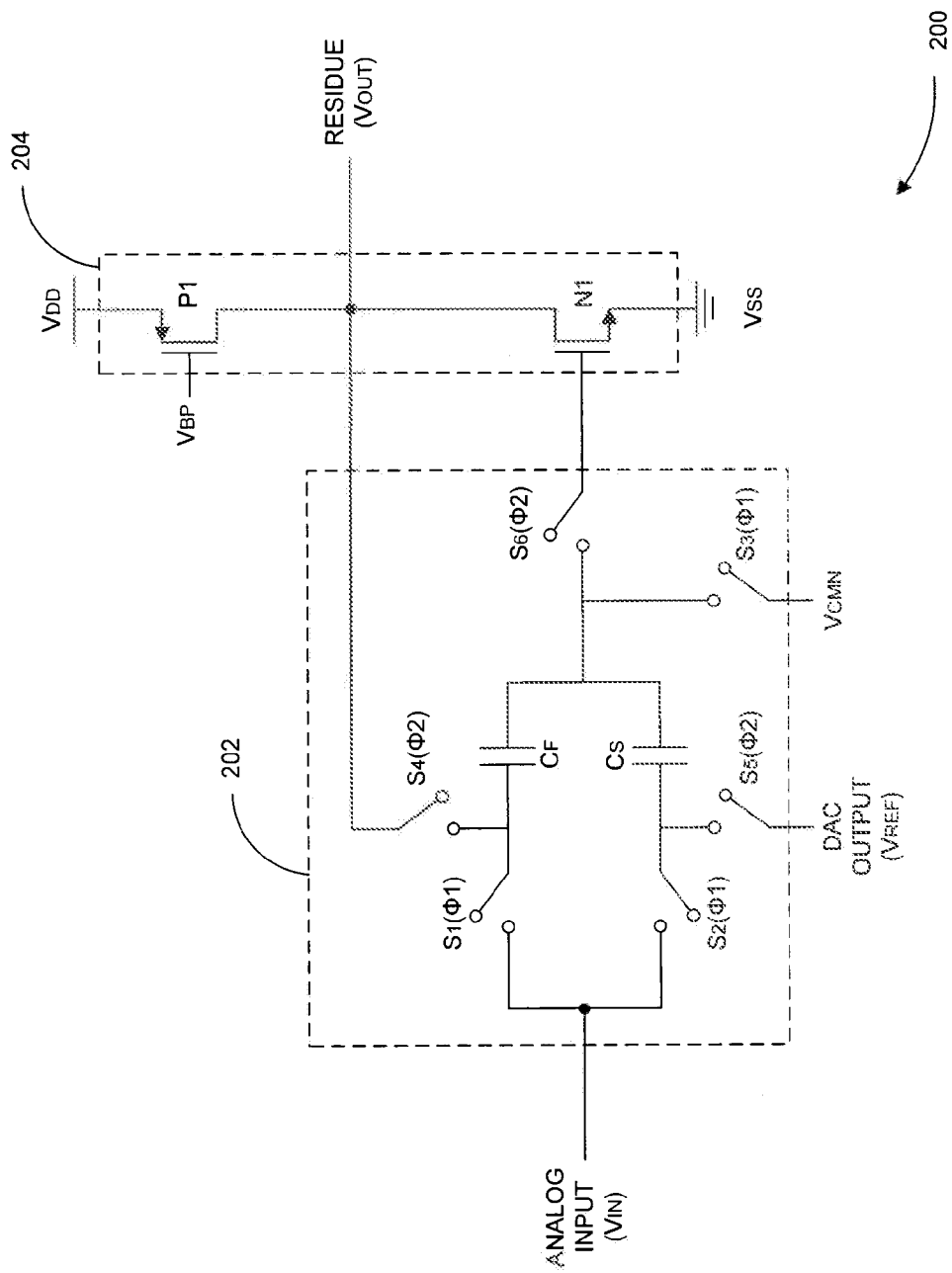
FIG. 2 illustrates a MDAC.

FIG. 2 illustrates a single-ended version of an MDAC 200 that includes a switched capacitor network 202 and a class-A transconductance amplifier 204. The functionality and implementation of DAC 114 has been omitted from FIG. 2 for clarity purposes.

MDAC 200 operates in two phases: a sampling phase and an amplification phase. At least two non-overlapping clock signals, labeled as $\phi 1$ and $\phi 2$ in FIG. 2, are used to control switches S1-S6 in switched capacitor network 202 to operate MDAC 200 in these two phases. During the sampling phase, clock signal $\phi 1$ controls switches S1, S2, and S3 to be closed, and clock signal $\phi 2$ controls switches S4, S5, and S6 to be open. Because switches S1, S2, and S3 are closed, the analog input voltage $V_{IN}$ is sampled with respect to common mode voltage $V_{CMN}$ onto both sampling capacitors $C_F$ and $C_S$. The common mode voltage $V_{CMN}$ is a DC voltage and is used to bias the n-type field effect transistor (NFET) N1 such that N1 provides proper amplification of the signal coupled to its gate (also referred to as the summing node of transconductance amplifier 204). After the sampling phase, the voltage across capacitors $C_F$ and $C_S$ is substantially equal to $V_{IN}-V_{CMN}$, the charge stored on capacitor $C_F$ is substantially equal to $Q_F=(V_{IN}-V_{CMN})*C_F$, and the charge stored on capacitor $C_S$ is substantially equal to $Q_S=(V_{IN}-V_{CMN})*C_S$.

During the amplification phase, clock signal φ2 controls switches S4, S5, and S6 to be closed, and clock signal φ1 controls switches S1, S2, and S3 to be open. Capacitor $C_F$ becomes a feedback capacitor coupled between the output (labeled as $V_{OUT}$ in FIG. 2) and input of transconductance amplifier 118, and capacitor $C_S$ samples the DAC output voltage $V_{REF}$ from DAC 114 (not shown). If $V_{REF}$ differs from $V_{IN}$, charge sharing between capacitors $C_S$ and $C_F$ occurs during the amplification phase. After the amplification phase, the voltage across capacitor $C_F$ is substantially equal to $V_{OUT}-V_{CMN}$, the voltage across capacitor $C_S$ is substantially equal to $V_{REF}-V_{CMN}$, the charge stored on capacitor $C_F$ is substantially equal to $Q_F=-C_F*(V_{OUT}-V_{CMN})$, and the charge stored on capacitor $C_S$ is substantially equal to $Q_S=-C_S*(V_{REF}-V_{CMN})$.

Because of charge conservation, the resultant output of MDAC 200 after the amplification phase can be determined by equating the sum of charge on capacitors $C_S$ and $C_F$ after the sampling phase to the sum of charge on capacitors $C_S$ and $C_F$ after the amplification phase, which is given by:

$$-C_F(V_{IN}-V_{CMN})-C_S(V_{IN}-V_{CMN})=-C_F(V_{OUT}-V_{CMN})-C_S(V_{REF}-V_{CMN}) \quad (1)$$

where the positive polarity sign of the charge on capacitors $C_S$ and $C_F$ points toward the summing node of transconductance amplifier 204 at virtual ground. Solving for the residue output voltage $V_{OUT}$, the operation of MDAC 200 amounts to:

$$V_{OUT} = V_{IN}\frac{C_F+C_S}{C_F} - V_{REF}\frac{C_S}{C_F} \quad (2)$$

Thus, MDAC 200 provides a residue output voltage $V_{OUT}$ that is given by the difference between $V_{IN}$ and $V_{REF}$ with some gain determined by the values of capacitors $C_S$ and $C_F$. This functionality is consistent with sample and hold circuit 110, DAC 114, subtractor 116, and amplifier 118. Without loss of generality, the expression for $V_{OUT}$ in equation (2) assumed $V_{CMN}=0$.

Transconductance amplifier 204 includes n-type field effect transistor (NFET) N1 and p-type field effect transistor (PFET) P1. N1 is biased into its saturation region of operation by common mode voltage $V_{CMN}$ as well as by the current provided by P1. P1 is biased by voltage $V_{BP}$ to behave as a DC current source. Transconductance amplifier 204 is commonly referred to as a single-ended class-A transconductance amplifier because it has a single amplifying element N1 that is biased so that it is always conducting current. As a result, the charge transfer from the power supply $V_{DD}$ to the capacitive load at the output of transconductance amplifier 204 is inherently inefficient because on average only a small fraction of this current goes to the load.

II. MDAC WITH IMPROVED POWER EFFICIENCY AND/OR PERFORMANCE

Figure 3:
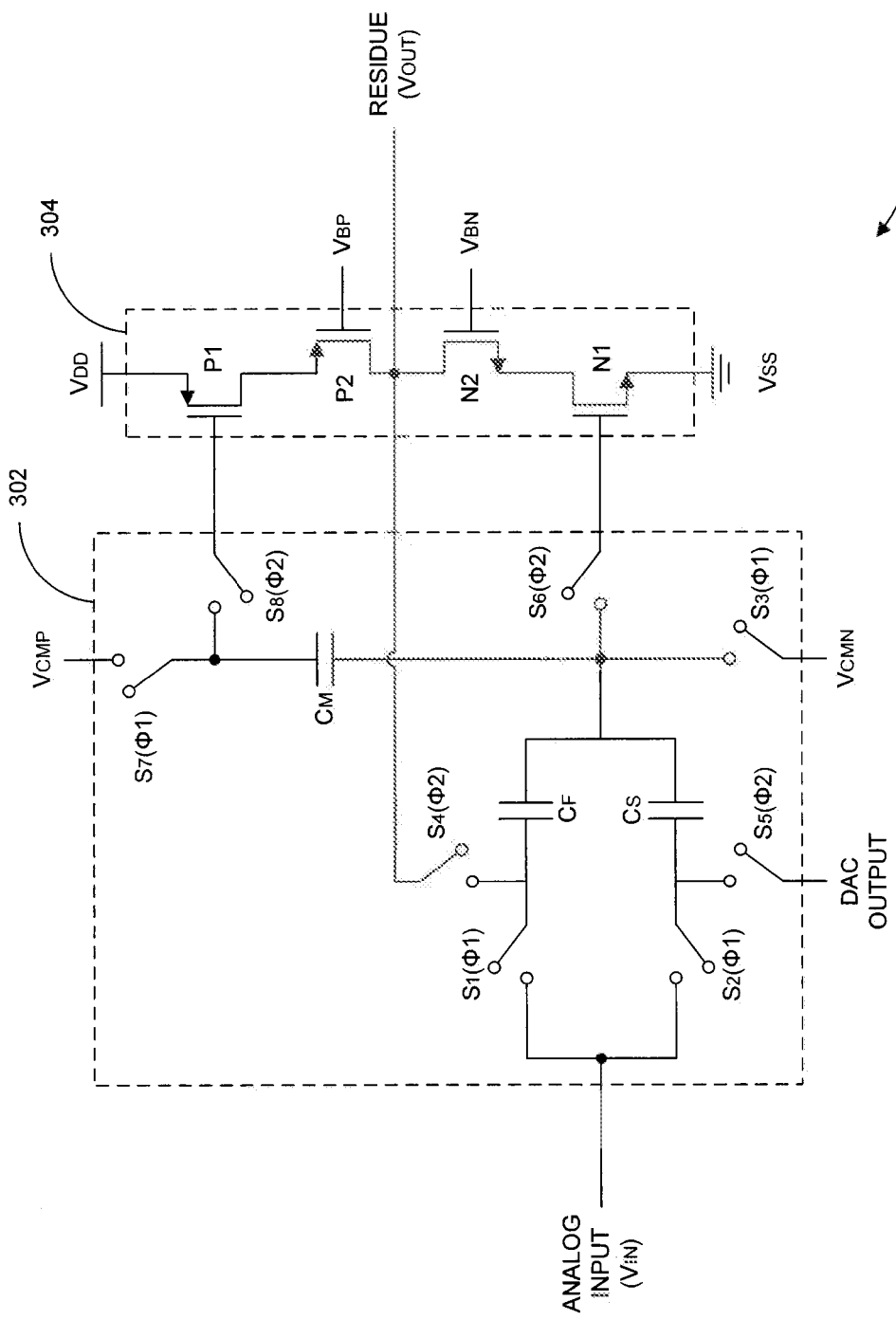
FIG. 3 illustrates a single-ended MDAC in accordance with embodiments of the present disclosure.

FIG. 3 illustrates a single-ended MDAC 300 that can provide a higher-level of power efficiency and/or performance in terms of bandwidth than MDAC 200, in accordance with embodiments of the present disclosure. In general, MDAC 300 is configured and operates in a similar manner as MDAC 200. However, MDAC 300 includes a complementary push-pull transconductance amplifier 304 and a switched capacitor network 302 with two additional switches S7 and S8 and a level-shifting capacitor $C_M$.

As shown in FIG. 3, complementary push-pull transconductance amplifier 304 specifically includes two complementary amplifying elements PFET P1 and NFET N1. This is in contrast to the single amplifying element N1 used in single-ended class-A transconductance amplifier 204. In general, it can be shown that, through the use of two complementary amplifying elements P1 and N1 and appropriate biasing, a larger fraction of the charge from the power supply $V_{DD}$ flowing through complementary push-pull transconductance amplifier 304 can be transferred to the capacitive load at the output of the amplifier compared to single-ended class-A transconductance amplifier 204. This allows MDAC 300 to operate at a higher power efficiency and/or performance level in terms of gain, bandwidth, and speed over MDAC 200. Amplifying elements P1 and N1 of complementary push-pull transconductance amplifier 304 can specifically be biased to operate in a class-A, class-B, or class-AB region of operation depending on power and performance demands. PFET P2 and NFET N2 of complementary push-pull transconductance amplifier 304 provide a cascode amplifier arrangement. P2 and N2 are respectively biased by voltages $V_{BP}$ and $V_{BN}$.

The signal to be amplified by complementary push-pull transconductance amplifier 304 is provided to the gates of both P1 and N1 (also referred to as the summing nodes of complementary push-pull transconductance amplifier 304). The additional switches S7 and S8 and level-shifting capacitor $C_M$ included in switched capacitor network 302 are used to provide both the signal to be amplified and the common mode voltage $V_{CMP}$ to the gate of P1. The level-shifting capacitor $C_M$ is specifically used to isolate the two DC common mode voltages $V_{CMP}$ and $V_{CMN}$, while allowing the AC small signal that is to be amplified to pass through to the gate of P1. The common mode voltage $V_{CMP}$ is a DC voltage and is used to bias P1 such that P1 provides proper amplification of the signal coupled to its gate. During the sampling phase of MDAC 300's operation, switch S7 is controlled by clock signal φ1 to be closed and switch S8 is controlled by clock signal φ2 to be open. During the amplification phase of MDAC 300's operation, switch S7 is controlled by clock signal φ1 to be open and switch S8 is controlled by clock signal φ2 to be closed.

It should be noted that other implementations of complementary push-pull transconductance amplifier 304 are possible. For example, other implementations of complementary push-pull amplifier 304 can use different transistors types (e.g., bipolar junction transistors), configurations (e.g., a non-cascode configuration), and/or additional elements.

Figure 4:
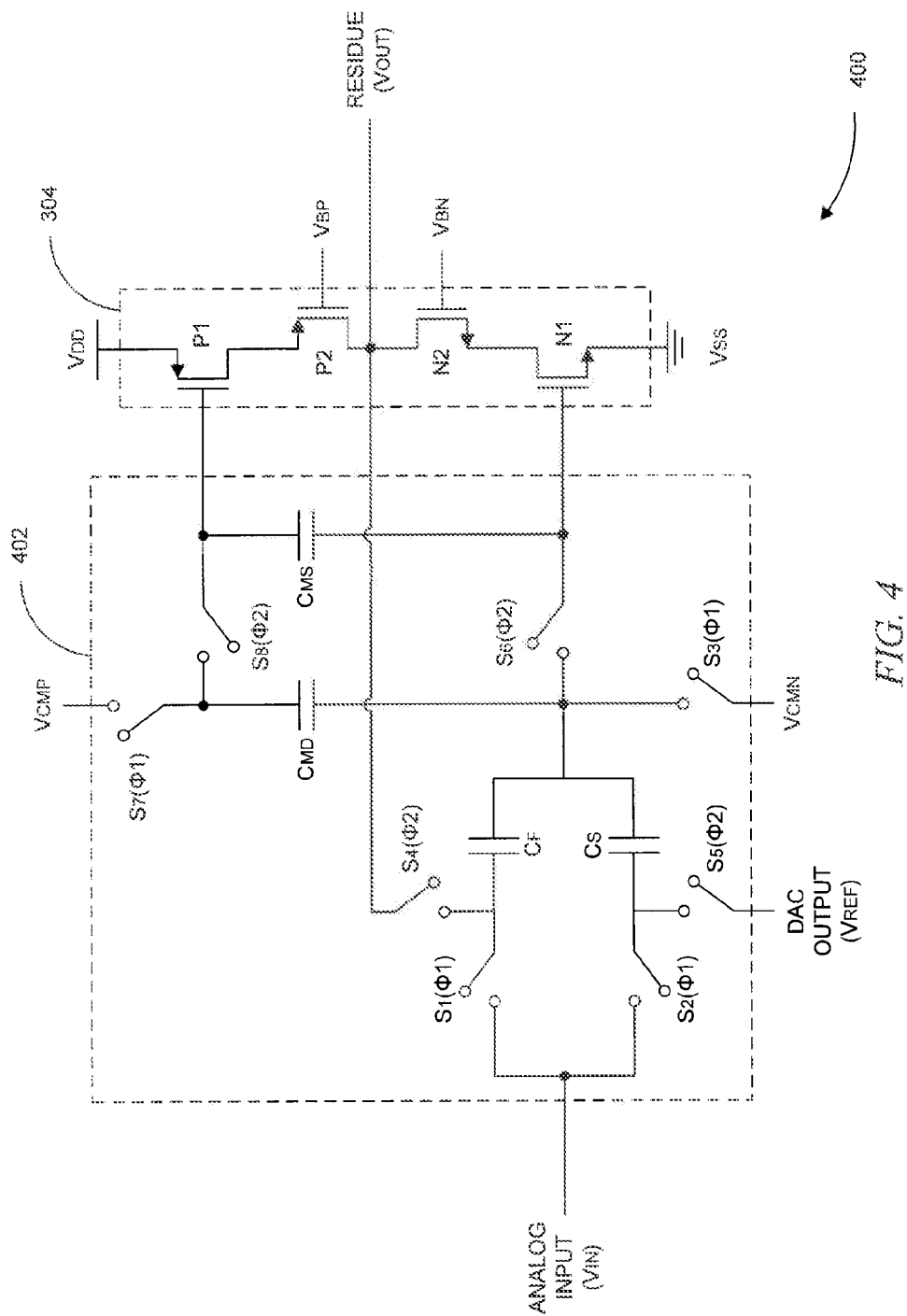
FIG. 4 illustrates a single-ended MDAC in accordance with embodiments of the present disclosure.

FIG. 4 illustrates a single-ended MDAC 400 that can provide a higher-level of power efficiency and/or performance in terms of gain, bandwidth, and speed than MDAC 200, in accordance with embodiments of the present disclosure. In general, MDAC 400 is configured and operates in a similar manner as MDAC 300. However, MDAC 400 has split level-shifting capacitor $C_M$ into two separate level-shifting capacitors: a static level-shifting capacitor $C_{MS}$ and a dynamic level-shifting capacitor $C_{MD}$. Static capacitor $C_{MS}$ remains coupled between the gates of P1 and N1 during both the sampling and amplification phase of operation. Dynamic capacitor $C_{MD}$, on the other hand, is charged by common mode voltages $V_{CMP}$ and $V_{CMN}$ during the sampling phase and gradually establishes the desired common mode voltages $V_{CMP}$ and $V_{CMN}$ on the gates of P1 and N1, respectively, during the amplification phase. This split cap configuration allows capacitor $C_{MD}$ to be reduced in size compared to $C_M$ in MDAC 300, which correspondingly allows the size of switches S7 and S8 to be reduced. For example, where switches S7 and S8 are implemented using pass transistors, the width-to-length ratio of the channels of the pass transistors can be reduced. Moreover, the charge averaging that occurs between capacitors $C_{MS}$ and $C_{MD}$ reduces sampling noise on the two capacitors.

Figure 5:
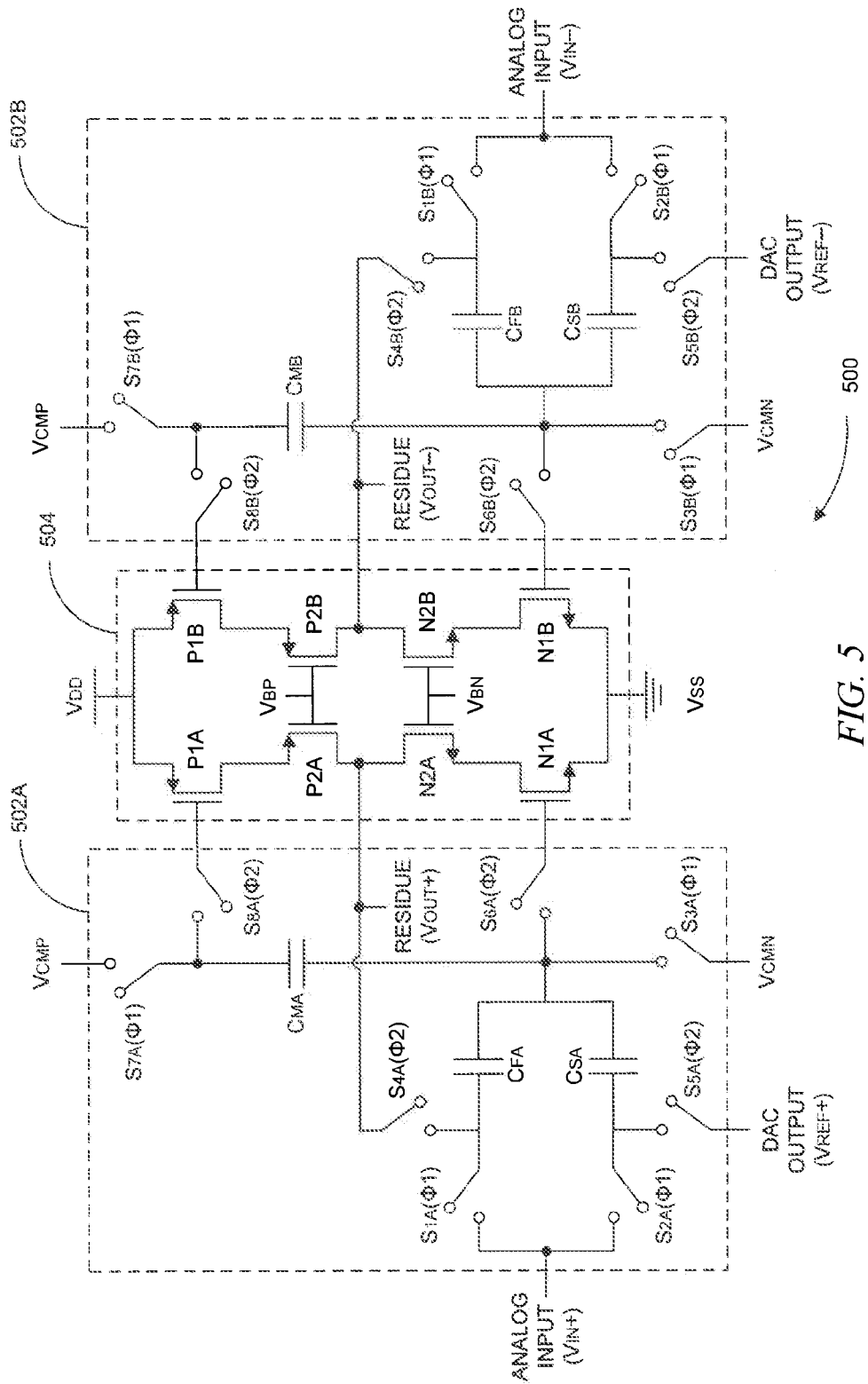
FIG. 5 illustrates a differential MDAC in accordance with embodiments of the present disclosure.

FIG. 5 illustrates a differential MDAC 500 that can provide a higher-level of power efficiency and/or performance in terms of bandwidth and speed than MDAC 200, in accordance with embodiments of the present disclosure. In general, MDAC 500 is configured and operates in a similar manner as MDAC 300. However, MDAC 500 is differential and includes two ends: a first end that includes switched capacitor network 502A and interfaces with a left side of complementary push-pull transconductance amplifier 504, and a second end that includes switched capacitor network 502B and interfaces with a right side of complementary push-pull transconductance amplifier 504. The first end of MDAC 500 processes the positive end of the analog input $V_{IN}+$ and the DAC output $V_{REF}+$ to provide the positive end of the residue output signal $V_{OUT}+$, and the second end of MDAC 500 processes the negative end of the analog input $V_{IN}-$ and the DAC output $V_{REF}-$ to provide the negative end of the residue output signal $V_{OUT}-$. In at least one embodiment, the left and right sides of MDAC 500 are (ideally) symmetrical and include similar elements arranged in the same manner.

It should be noted that, in other embodiments of MDAC 500, level-shifting capacitors $C_{MA}$ and $C_{MB}$ can be implemented in a similar split configuration as shown in FIG. 4.

Figure 6:
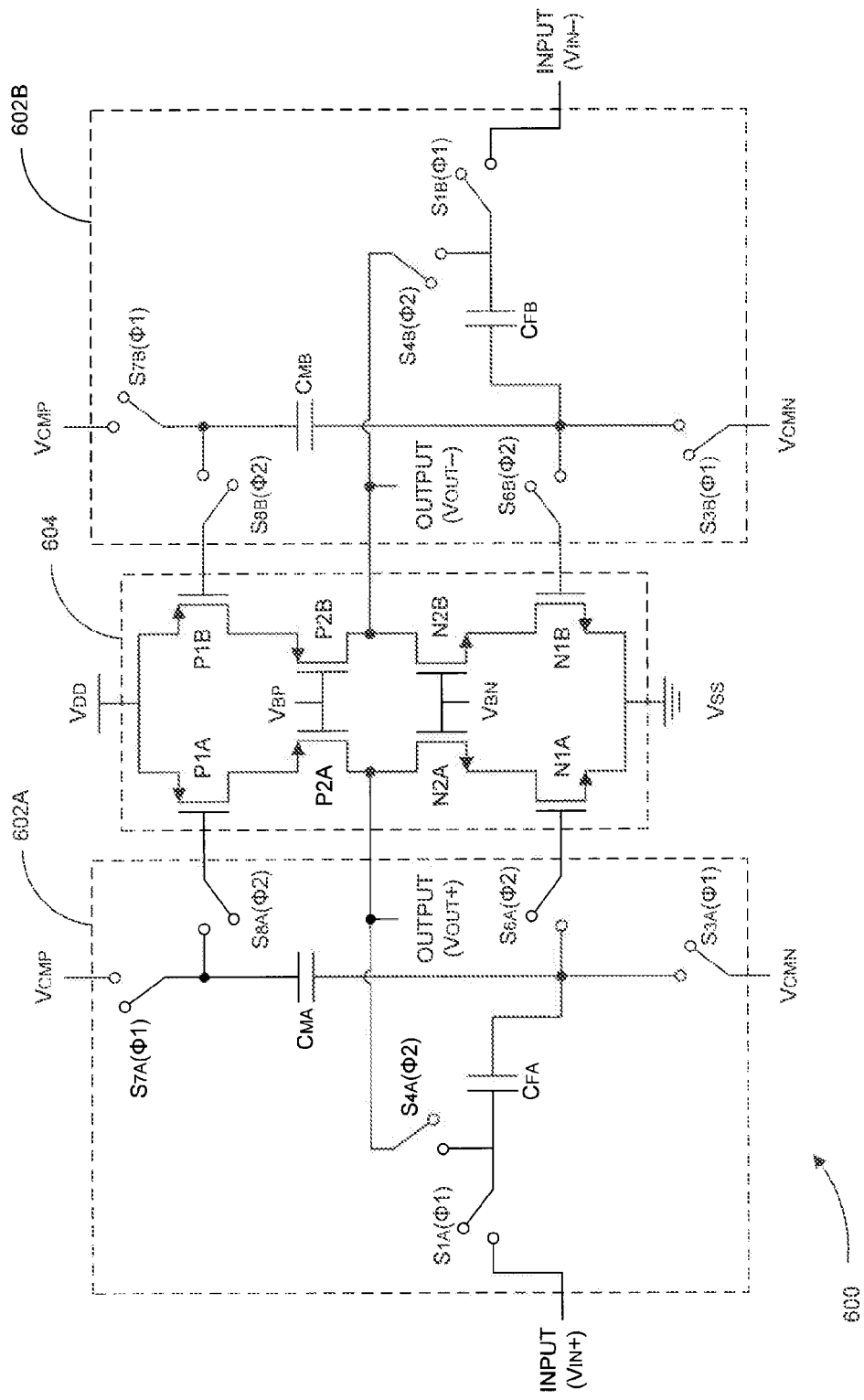
FIG. 6 illustrates a differential, unity-gain amplifier in accordance with embodiments of the present disclosure.

It should be further noted that the switched-capacitor network and complementary push-pull transconductance amplifier configurations disclosed herein are not limited to applications with an MDAC. For example, FIG. 6 illustrates the basic configuration of MDAC 500 illustrated in FIG. 5 in a more generalized form, in accordance with embodiments of the disclosure. Specifically, switched capacitor networks 602A and 602B in FIG. 6 have been modified to omit switches S2A, S2B, S5A, and S5B, and capacitors $C_{MA}$ and $C_{MB}$. As modified, the switched capacitor networks 602A and 602B in combination with the complementary push-pull amplifier are configured as a generalized, unity-gain amplifier 600 (or buffer). The differential input signal $V_{IN}+/-$ received by unity-gain amplifier 600 undergoes unit gain amplification and is output by unity-gain amplifier via differential output signal $V_{OUT}+/-$.

As would be appreciated by one of ordinary skill in the art, unity-gain amplifier 600 can be modified to include further elements such as resistors, inductors, capacitors, and switches to implement any number of different functions. For example, unity-gain amplifier 600 can be modified to include further elements such as resistors, inductors, capacitors, and switches to implement a non-unity gain function. In addition, unity-gain amplifier 600 can be modified such that level-shifting capacitors $C_{MA}$ and $C_{MB}$ can be implemented in a similar split configuration as shown in FIG. 4.

Figure 7:
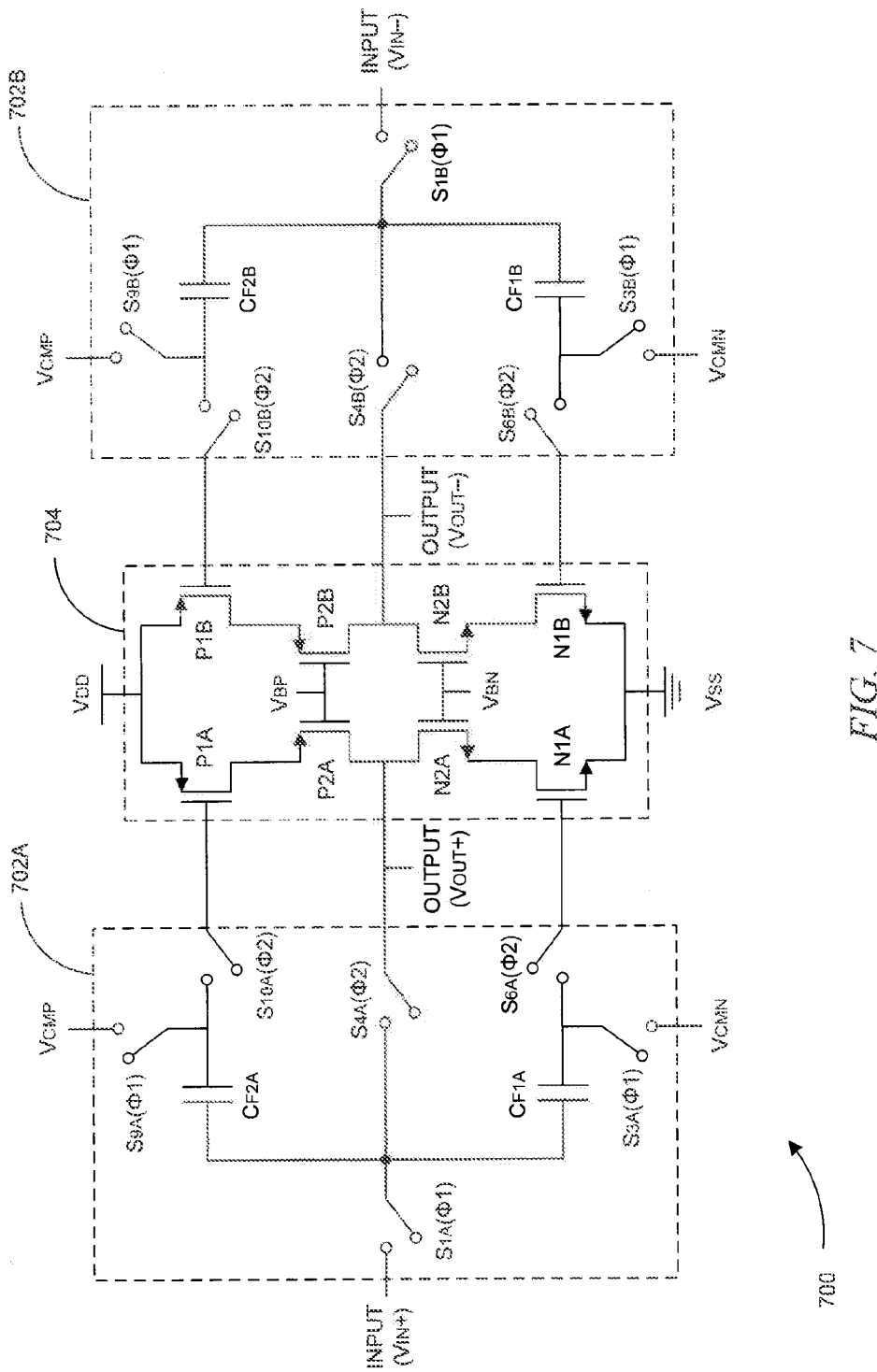
FIG. 7 illustrates a differential, unity-gain amplifier in accordance with embodiments of the present disclosure.

FIG. 7 illustrates a unity-gain amplifier 700 that is a variant of unity-gain amplifier 600, in accordance with embodiments of the present disclosure. Specifically, switched capacitor networks 702A and 702B in FIG. 7 have been modified to omit switches S7A, S7B, S8A, and S8B, and capacitors $C_{MA}$ and $C_{MB}$, and further include switches S9A, S9B, S10A, and S10B, and capacitors $C_{F2A}$ and $C_{F1A}$. In general, switches S9A and S10A and capacitor $C_{F2A}$ function in the same manner as switches S3A and S6A and capacitor $C_{F1A}$ as described above. Similarly, switches S9B and S10B and capacitor $C_{F2B}$ function in the same manner as switches S3B and S6B and capacitor $C_{F1B}$ as described above.

As would be appreciated by one of ordinary skill in the art, unity-gain amplifier 700 can be modified to include further elements such as resistors, inductors, capacitors, and switches to implement any number of different functions. For example, unit-gain amplifier 700 can be modified to include further elements such as resistors, inductors, capacitors, and switches to implement a non-unity gain function.

As would be further appreciated by one of ordinary skill in the art, the differential amplifiers shown in FIGS. 5-7 can further include a tail current source coupled to the sources of the NFET amplifying elements and/or the PFET amplifying elements (i.e., the differential amplifiers shown in FIGS. 5-7 can be implemented as source-coupled pair amplifiers or, as referred to in British literature, long-tailed pair amplifiers). In general, the further use of a tail current source helps to make the bias currents of both sides of a different amplifier independent of the input common mode level of the amplifier.

Moreover, as would be further appreciated by one of ordinary skill in the art, the differential amplifiers shown in FIGS. 6 and 7 can be easily modified to function as single-ended unity gain amplifiers in other implementations. This modification can be as simple as implementing only one of the two symmetrical sides of the differential amplifiers shown in FIGS. 6 and 7. The level-shifting capacitor $C_{MA}$ (or $C_{MB}$) in a single-ended version of the unity gain amplifier shown in FIG. 6 can be implemented in a similar split configuration as shown in FIG. 4.

III. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A switched-capacitor amplifier for amplifying an input signal, comprising:
   a first switch configured to couple the input signal to a first end of a sampling capacitor;
   a second switch configured to couple a first direct current (DC) signal to a second end of the sampling capacitor;
   a third switch configured to couple an output of a complementary push-pull amplifier to the first end of the sampling capacitor;
   a fourth switch configured to couple a first summing node of the complementary push-pull amplifier to the second end of the sampling capacitor;
   a fifth switch configured to couple a first end of a dynamic level-shifting capacitor to a second summing node of the complementary push-pull amplifier, wherein a second end of the dynamic level-shifting capacitor is coupled to the second end of the sampling capacitor; and
   a sixth switch configured to couple a second DC signal to the first end of the dynamic level-shifting capacitor.

2. The switched-capacitor amplifier of claim 1, wherein the complementary push-pull amplifier comprises a p-type field-effect transistor (PFET) and a n-type field-effect transistor (NFET), wherein both the PFET and, the NFET are configured as amplifying elements.

3. The switched-capacitor amplifier of claim 1, wherein the first switch and the second switch are configured to be closed while the third switch and the fourth switch are opened.

4. The switched-capacitor amplifier of claim 1, wherein the first switch and the second switch are configured to be opened while the third switch and the fourth switch are closed.

5. The switched-capacitor amplifier of claim 1, further comprising a static level-shifting capacitor coupled between the first summing node of the complementary push-pull amplifier and a second summing node of the complementary push-pull amplifier.

6. The switched-capacitor amplifier of claim 1, further comprising:
a seventh switch configured to couple the input signal to a first end of an additional sampling capacitor; and
an eighth switch configured to couple a digital-to-analog converter (DAC) output signal to the first end of the additional sampling capacitor.

7. A converter stage for a pipelined analog-to-digital converter (ADC), comprising:
an ADC configured to convert an analog input signal into a digital output signal; and
a multiplying digital-to-analog converter (MDAC) comprising:
a first switch configured to couple the analog input signal to a first end of a sampling capacitor;
a second switch configured to couple a first direct current (DC) signal to a second end of the sampling capacitor;
a third switch configured to couple an output of a complementary push-pull amplifier to the first end of the sampling capacitor;
a fourth switch configured to couple a first summing node of the complementary push-pull amplifier to the second end of the sampling capacitor;
a fifth switch configured to couple a first end of a dynamic level-shifting capacitor to a second summing node of the complementary push-pull amplifier, wherein a second end of the dynamic level-shifting capacitor is coupled to the second end of the sampling capacitor; and
a sixth switch configured to couple a second DC signal to the first end of the dynamic level-shifting capacitor.

8. The converter stage of claim 7, wherein the complementary push-pull amplifier comprises a p-type field-effect transistor (PFET) and a n-type field-effect transistor (NFET), wherein both the PFET and the NFET are configured as amplifying elements.

9. The converter stage of claim 7, wherein the first switch and the second switch are configured to be closed while the third switch and the fourth switch are opened.

10. The converter stage of claim 7, wherein the first switch and the second switch are configured to be opened while the third switch and the fourth switch are closed.

11. The converter stage of claim 7, further comprising a static level-shifting capacitor coupled between the first summing node of the complementary push-pull amplifier and a second summing node of the complementary push-pull amplifier.

12. The converter stage of claim 7, further comprising:
a seventh switch configured to couple the analog input signal to a first end of an additional sampling capacitor; and
an eighth switch configured to couple a digital-to-analog converter (DAC) output signal to the first end of the additional sampling capacitor.

13. A switched-capacitor amplifier for amplifying an input signal, comprising:
a complementary push-pull amplifier; and
a switched capacitor network comprising:
a first switch configured to couple the input signal to a first end of a sampling capacitor;
a second switch configured to couple a first direct current (DC) signal to a second end of the sampling capacitor;
a third switch configured to couple an output of the complementary push-pull amplifier to the first end of the sampling capacitor;
a fourth switch configured to couple a first summing node of the complementary push-pull amplifier to the second end of the sampling capacitor;
a fifth switch configured to couple a first end of a dynamic level-shifting capacitor to a second summing node of the complementary push-pull amplifier, wherein a second end of the dynamic level-shifting capacitor is coupled to the second end of the sampling capacitor; and
a sixth switch configured to couple a second DC signal to the first end of the dynamic level-shifting capacitor.

14. The switched-capacitor amplifier of claim 13, wherein the complementary push-pull amplifier comprises a p-type field-effect transistor (PFET) and a n-type field-effect transistor (NFET), wherein both the PFET and the NFET are configured as amplifying elements.

15. The switched-capacitor amplifier of claim 13, further comprising a static level-shifting capacitor coupled between the first summing node of the complementary push-pull amplifier and a second summing node of the complementary push-pull amplifier.

16. The switched-capacitor amplifier of claim 13, further comprising:
a seventh switch configured to couple the input signal to a first end of an additional sampling capacitor; and
an eighth switch configured to couple a digital-to-analog converter (DAC) output signal to the first end of the additional sampling capacitor.

17. A switched-capacitor amplifier for amplifying an input signal, comprising:
a first switch configured to couple the input signal to a first end of a first sampling capacitor and to a first end of a second sampling capacitor;
a second switch configured to couple a DC signal to a second end of the first sampling capacitor;
a third switch configured to couple the DC signal to a second end of the second sampling capacitor;
a fourth switch configured to couple an output of a complementary push-pull amplifier to the first end of the first sampling capacitor and to the first end of the second sampling amplifier;
a fifth switch configured to couple a first summing node of the complementary push-pull amplifier to the second end of the first sampling capacitor; and
a sixth switch configured to couple a second summing node of the complementary push-pull amplifier to the second end of the second sampling capacitor.

18. The switched-capacitor amplifier of claim 17, wherein the complementary push-pull amplifier comprises a p-type field-effect transistor (PFET) and a n-type field-effect transistor (NFET), wherein both the PFET and the NFET are configured as amplifying elements.

19. The switched-capacitor amplifier of claim 17, wherein the first switch and the second switch are configured to be closed while the third switch and the fourth switch are opened.

20. The switched-capacitor amplifier of claim 17, wherein the first switch and the second switch are configured to be opened while the third switch and the fourth switch are closed.

* * * * *

UNITED STATES PATENT AND TRADEMARK OFFICE
CERTIFICATE OF CORRECTION

PATENT NO. : 8,686,888 B2  Page 1 of 1
APPLICATION NO. : 13/543386
DATED : April 1, 2014
INVENTOR(S) : Wei-Te Chou et al.

It is certified that error appears in the above-identified patent and that said Letters Patent is hereby corrected as shown below:

In the Claims:

Column 6, line 66, Claim 2, please replace "and, the NFET" with --and the NFET--.

Signed and Sealed this
Seventeenth Day of June, 2014

Michelle K. Lee
*Deputy Director of the United States Patent and Trademark Office*